US011024245B2

(12) United States Patent
Ji et al.

(10) Patent No.: US 11,024,245 B2
(45) Date of Patent: Jun. 1, 2021

(54) GATE DRIVER AND DISPLAY DEVICE USING THE SAME

(71) Applicant: LG DISPLAY CO., LTD., Seoul (KR)

(72) Inventors: Hyelim Ji, Paju-si (KR); Yongseok Park, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 60 days.

(21) Appl. No.: 15/798,004

(22) Filed: Oct. 30, 2017

(65) Prior Publication Data

US 2018/0122322 A1    May 3, 2018

(30) Foreign Application Priority Data

Oct. 31, 2016  (KR) .................. 10-2016-0144006

(51) Int. Cl.
*G09G 3/36*    (2006.01)
*G11C 19/28*    (2006.01)
*H03K 17/687*    (2006.01)

(52) U.S. Cl.
CPC ......... *G09G 3/3677* (2013.01); *G09G 3/3688* (2013.01); *G11C 19/28* (2013.01); *H03K 17/6871* (2013.01); *G09G 2300/0871* (2013.01); *G09G 2310/0286* (2013.01); *G09G 2310/08* (2013.01); *G09G 2320/0223* (2013.01); *G09G 2330/06* (2013.01)

(58) Field of Classification Search
CPC .............. G09G 3/3677; G09G 3/3688; G09G 2300/0871; G09G 2310/0286; G09G 2310/08; G09G 2320/0223; G09G 2330/06; G11C 19/28; H03K 17/6871
See application file for complete search history.

(56) References Cited

U.S. PATENT DOCUMENTS

| | | | | |
|---|---|---|---|---|
| 8,477,094 | B2* | 7/2013 | Jung ...................... | G11C 19/28 345/100 |
| 2004/0189585 | A1* | 9/2004 | Moon .................. | G11C 19/184 345/100 |
| 2006/0139292 | A1* | 6/2006 | Yoon ...................... | G11C 19/00 345/100 |
| 2007/0195920 | A1* | 8/2007 | Tobita .................. | G11C 19/184 377/64 |
| 2007/0274433 | A1* | 11/2007 | Tobita .................. | G09G 3/3677 377/64 |

(Continued)

FOREIGN PATENT DOCUMENTS

| CN | 103440839 A | 12/2013 |
|---|---|---|
| CN | 104252851 A | 12/2014 |
| CN | 105719590 A | 6/2016 |

*Primary Examiner* — Sejoon Ahn

(74) *Attorney, Agent, or Firm* — Seed Intellectual Property Law Group LLP

(57) ABSTRACT

A gate driver and a display device using the same are disclosed. The gate driver includes a plurality of stages connected in a cascade connection manner, and each of the stages include a clock input configured to receive a shift clock signal, a first output terminal, and a second output terminal. Each of the stages generates a first output voltage that is transmitted to another stage through the first output terminal and a second output voltage that is supplied to a gate line of a display panel through the second output terminal. Each of the stages includes a first diode connected between the clock input and the first output terminal.

18 Claims, 12 Drawing Sheets

(56) References Cited

U.S. PATENT DOCUMENTS

| | | | | |
|---|---|---|---|---|
| 2008/0130822 A1* | 6/2008 | Hsu | ............... | G11C 19/28 |
| | | | | 377/79 |
| 2009/0115792 A1* | 5/2009 | Otose | ............... | G11C 19/28 |
| | | | | 345/559 |
| 2013/0148775 A1* | 6/2013 | Shin | ............... | G11C 19/28 |
| | | | | 377/69 |
| 2013/0249884 A1* | 9/2013 | Kim | ............... | G09G 3/3677 |
| | | | | 345/212 |
| 2014/0091997 A1* | 4/2014 | Han | ............... | G09G 3/3611 |
| | | | | 345/92 |
| 2015/0287376 A1* | 10/2015 | Lim | ............... | G09G 3/3677 |
| | | | | 345/92 |
| 2015/0356909 A1* | 12/2015 | Lim | ............... | H03K 17/162 |
| | | | | 345/205 |
| 2016/0210928 A1* | 7/2016 | Cho | ............... | G11C 19/184 |

* cited by examiner

US 11,024,245 B2

GATE DRIVER AND DISPLAY DEVICE USING THE SAME

CROSS-REFERENCE TO RELATED APPLICATION

This application claims the priority benefit of Korean Patent Application No. 10-2016-0144006 filed on Oct. 31, 2016, the entire contents of which is incorporated herein by reference for all purposes as if fully set forth herein.

BACKGROUND

Technical Field

The present disclosure relates to a gate driver and a display device using the same.

Description of the Related Art display device includes a data driver for supplying a data signal to data lines of a pixel array, a gate driver (or a scan driver) for sequentially supplying a gate pulse (or a scan pulse) synchronized with the data signal to gate lines (or scan lines) of the pixel array, a timing controller for controlling the data driver and the gate driver, and the like.

Each of pixels may include a thin film transistor (hereinafter, referred to as TFT) which supplies a voltage of a data line to a pixel electrode in response to the gate pulse. The gate pulse swings between a gate-on voltage (VGH) and a gate-off voltage (VGL). The gate-on voltage VGH is set to a voltage higher than a threshold voltage of the TFT, and the gate-off voltage VGH is set to a voltage lower than a threshold voltage of the TFT.

Recently, a technique of embedding the gate driver in a display panel together with the pixel array has been applied. Hereinafter, the gate driver embedded in the display panel will be referred to as a gate in panel (GIP) circuit. The GIP circuit includes a shift register. The shift register includes a plurality of stages connected in a cascade connection to shift an output voltage in accordance with a shift clock timing.

The gate pulse sequentially selects pixels to be charged with a data voltage line-by-line in synchronization with the data voltage of an input image, that is, a pixel voltage. A stage of the shift register receives a start pulse or a carry signal received from a previous stage as a start pulse, and generates an output when a clock is input.

As shown in FIGS. 1 and 2, each of the stages includes a pull-up transistor Tu that charges an output terminal in response to a Q node voltage to raise an output voltage Vout (n), a pull-down transistor Td that discharges the output terminal in response to a QB node voltage to lower the output voltage, and a switch circuit 10 for charging and discharging a Q node and a QB node. The output terminal of each of the stages is connected to a gate line of the display panel.

When the Q node is pre-charged by a gate-on voltage VGH and a shift clock CLK is input to a drain of the pull-up transistor Tu, the pull-up transistor Tu charges the output terminal up to the gate-on voltage VGH of the shift clock CLK. When the shift clock CLK is input to the drain of the pull-up transistor Tu in a state that the pre-charged Q node is floated, the Q node voltage floated is raised to 2VGH by bootstrapping through a capacitance between the drain and a gate of the pull-up transistor Tu. At this time, the pull-up transistor Tu is turned on by the 2VGH voltage of the Q node and a voltage of the output terminal rises to the VGH. When the QB node voltage is charged by the VGH, the pull-down transistor Td supplies a gate-off voltage VGL to the output terminal to discharge the output voltage Vout (n) to VGL.

The switch circuit 10 charges the Q node in response to a start pulse input through a VST terminal or a carry signal received from a previous stage and discharges the Q node in response to a signal received through an RST terminal or a VNEXT terminal. A reset signal for simultaneously discharging the Q node of all the stages S(N−1), S(N), and S(N+1) is supplied to the RST terminal. A carry signal generated from a next stage is supplied to the VNEXT terminal. The switch circuit 10 can charge and discharge the QB node as opposed to the Q node by using an inverter.

A TFT including amorphous silicon (a-Si) (hereinafter, referred to as "a-Si TFT") can restore a threshold voltage shift by applying an AC voltage. For this reason, the GIP circuit implemented with the a-Si TFT was able to restore a threshold voltage shift of the pull-down transistor by driving the QB node with an AC voltage.

Recently, due to a low mobility of the a-Si TFT, applying a TFT including an oxide semiconductor (hereinafter, referred to as an "oxide TFT") to switch elements of a pixel and a GIP circuit of a high resolution model is being studied. The oxide TFT is advantageous for realizing high performance of the display device, but it is difficult to compensate for degradation of the TFT characteristics. In an oxide TFT, when the threshold voltage is shifted due to the DC gate bias stress and its characteristics are degraded, even when a voltage of the opposite polarity is supplied to the gate, there is almost no recovery of the threshold voltage. According to an experimental result of applying the oxide TFT to the pull-down transistor of the GIP circuit, since the degradation of the oxide TFT is not recovered even though the QB node is driven by the AC voltage, the threshold voltage shift of the pull-down transistor becomes severe with time. As a result, the voltage of the gate line is not discharged through the pull-down transistor, as shown in FIG. 3, and a ripple other than a normal output occurs when the shift clock occurs. In FIG. 3, "$N^{th}$ output" is an output voltage output from an Nth stage of the GIP circuit, and the other multi-output voltage is a ripple component that is not discharged through the pull-down transistor. The multi-output of the GIP circuit may cause fluctuation of the pixel voltage and cause image quality degradation.

BRIEF SUMMARY

The disclosure provides a gate driver capable of discharging effectively a ripple from an output voltage of a GIP circuit, and a display device using the same.

In one embodiment, there is provided a gate driver including a plurality of stages connected in a cascade connection manner, and each of the stages include a clock input configured to receive a shift clock signal, a first output terminal, and a second output terminal.

Each of the stages generates a first output voltage that is transmitted to another stage through the first output terminal and a second output voltage that is supplied to a gate line of a display panel through the second output terminal. Each of the stages includes a first diode connected between the clock input and the first output terminal.

The first diode may be a diode-connected transistor.

When a voltage of the first output terminal is higher than a voltage of the clock input by at least a threshold voltage of the first diode, the first diode may be turned on and the voltage of the first output terminal may be discharged through the clock input.

Each of the stages may include a second diode connected between the clock input and the second output terminal.

When a voltage of the second output terminal is higher than a voltage of the clock input by at least a threshold voltage of the second diode, the second diode may be turned on and the voltage of the second output terminal may be discharged through the clock input.

The first and second diodes may be diode-connected transistors.

Each of the stages may include a plurality of transistors. Each of the transistors may include an oxide semiconductor.

Each of the stages may include a first pull-up transistor configured to raise a voltage of the first output terminal depending on a voltage of a Q node, a second pull-up transistor configured to raise a voltage of the second output terminal depending on the voltage of the Q node, a first pull-down transistor configured to lower the voltage of the first output terminal depending on a voltage of a first QB node, a second pull-down transistor configured to lower the voltage of the second output terminal depending on the voltage of the first QB node, a third pull-down transistor configured to lower the voltage of the first output terminal depending on a voltage of a second QB node that is charged alternately with the first QB node, and a fourth pull-down transistor configured to lower the voltage of the second output terminal depending on the voltage of the second QB node.

A first plurality of transistors configured to switch a discharge path of the second output terminal may be connected to a first gate-off voltage terminal (VSS1). A second plurality of transistors configured to switch a discharge path of the Q node, the QB nodes and the first output terminal may be connected to a second gate-off voltage terminal (VSS2). A second gate-off voltage supplied to the VSS2 terminal may be a voltage lower than a first gate-off voltage supplied to the VSS1 terminal.

The first QB nodes of neighboring stages may be connected to each other, and the second QB nodes of neighboring stages may be connected to each other.

In another embodiment, there is provided a display device including a display panel in which data lines and gate lines are arranged in intersecting directions, and pixels are arranged in a matrix form. A display driver is included that includes a shift register having a plurality of stages connected in a cascade manner and configured to write data of an input image to the pixels. Each of the stages include a clock input configured to receive a shift clock signal, a first output terminal configured to supply a first output voltage to another stage, a second output terminal configured to supply a second output voltage to a gate line of the display, and a first diode connected between the clock input and the first output terminal.

In yet another embodiment, a gate driver is provided that includes a plurality of stages. Each of the stages includes: a clock input configured to receive a shift clock signal; an output terminal configured to supply an output voltage to another stage of the gate driver; a pull-up transistor having a first electrode coupled to the clock input, a second electrode coupled to the output terminal, and a gate terminal coupled to a Q node; a first pull-down transistor having a first electrode coupled to a low supply voltage, a second electrode coupled to the output terminal, and a gate electrode coupled to a first QB node; a second pull-down transistor having a first electrode coupled to the low supply voltage, a second electrode coupled to the output terminal, and a gate electrode coupled to a second QB node; and a diode coupled between the clock input and the output terminal.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
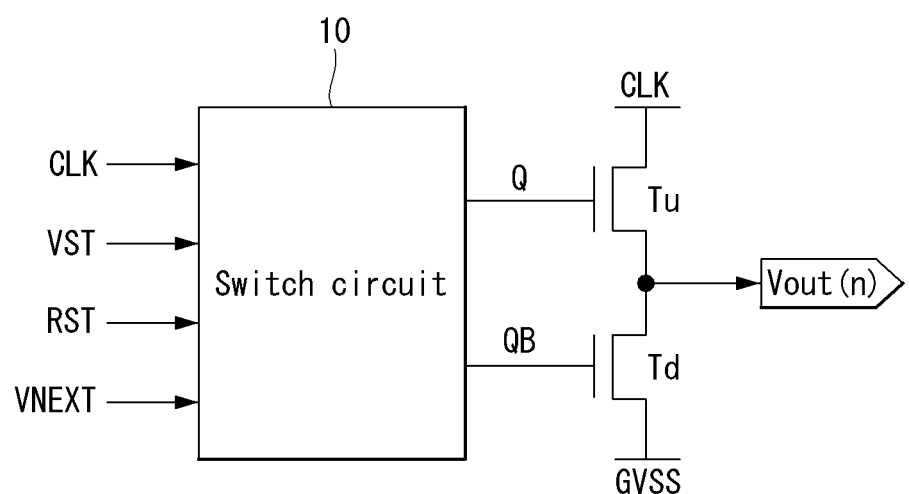
FIG. 1 schematically illustrates one stage for outputting a gate pulse in a shift register of a gate driver as may be known in the related art.
Figure 2:
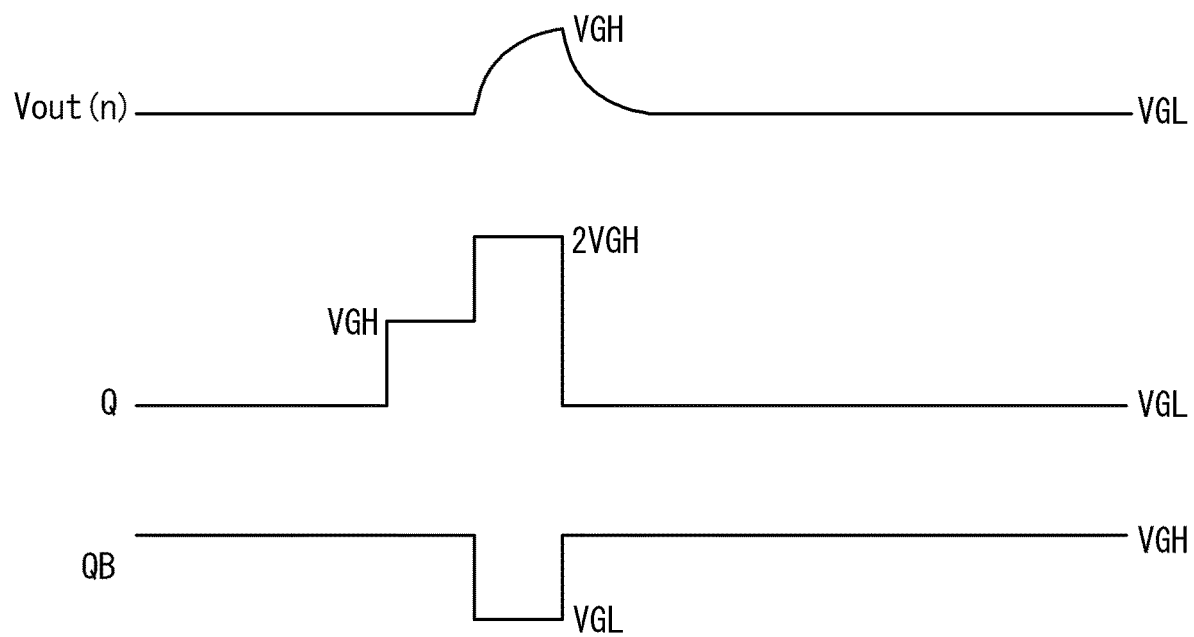
FIG. 2 is a waveform diagram illustrating operation of a stage shown in FIG. 1.
Figure 3:
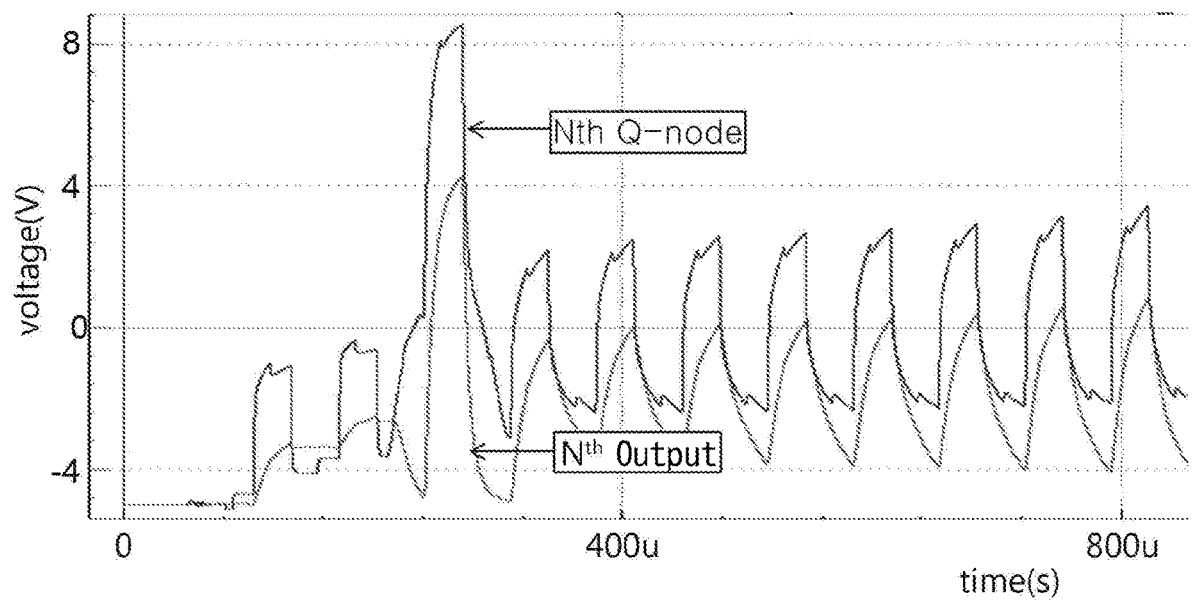
FIG. 3 is a diagram illustrating a ripple voltage generated when a pull-down transistor is degraded at an output voltage of a gate drive circuit.

Advantages and features of the present disclosure and methods for accomplishing the same will become apparent with reference to embodiments described in detail below with reference to the accompanying drawings. However, the present disclosure is not limited to the embodiments disclosed below, and may be implemented in various forms. These embodiments are provided so that the present disclosure will be exhaustively and completely described, and will fully convey the scope of the present disclosure to those skilled in the art to which the present disclosure pertains. The present disclosure is defined by the scope of the claims.

Shapes, sizes, ratios, angles, number, and the like illustrated in the drawings for describing embodiments of the present disclosure are merely exemplary, and embodiments of the present disclosure are not limited thereto. Like reference numerals designate like elements throughout the description. In the following description, when a detailed description of well-known functions or configurations related to this document is determined to unnecessarily cloud a gist of the disclosure, the detailed description thereof will be omitted. In the present disclosure, when the terms "include," "have," "comprised of," etc. are used, other components may be added unless "~only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above," "under or below," "next to" another structure, this description should be construed as including a case in which the structures contact each other as well as a case in which a third structure is disposed therebetween.

In the following description of the embodiment, the terms "first," "second," etc. may be used to describe various components, but the components are not limited by such terms. These terms are only used to distinguish one component from another component. Therefore, the first component mentioned below may be the second component within the technical spirit of the disclosure.

The features of various embodiments of the present disclosure can be partially combined or entirely combined with each other, and is technically capable of various interlocking and driving. The embodiments can be independently implemented, or can be implemented in conjunction with each other.

Hereinafter, preferred embodiments of the disclosure will be described in detail with reference to the accompanying drawings. Like reference numerals designate like elements throughout the description. In the following description, when a detailed description of well-known functions or configurations related to this document is determined to unnecessarily cloud a gist of the disclosure, the detailed description thereof will be omitted.

A display device according to an embodiment of the disclosure may be implemented as a flat panel display device such as a liquid crystal display (LCD), an OLED display, or the like. In the following embodiments, the liquid crystal display is described as an example of the flat panel display device, but the disclosure is not limited thereto. For example, the disclosure is applicable to any display device including an in-cell touch sensor.

A gate driver according to an embodiment of the disclosure may include a thin film transistor (TFT) of an n-type or p-type metal oxide semiconductor field effect transistor (MOSFET) structure. Although an n-type TFT is used as an example in describing the following embodiments, it should be noted that the embodiments of the disclosure are not limited to this. The TFT is a three-electrode element including a gate, a source, and a drain. The source is an electrode that supplies carriers to the transistor. In the TFT, the carriers start to flow from the source. The drain is an electrode in which the carriers exit from the TFT to the outside. That is, the carriers in the MOSFET flow from the source to the drain. In an instance of the n-type MOSFET (NMOS), since the carriers are electrons, a source voltage is lower than a drain voltage so that the electrons can flow from the source to the drain. In the n-type MOSFET, a current flows from the drain to the source because the electrons flow from the source to the drain. In an instance of the p-type MOSFET (PMOS), since the carriers are holes, the source voltage is higher than the drain voltage so that the holes can flow from the source to the drain. In the p-type MOSFET, the current flows from the source to the drain because the holes flow from the source to the drain. It should be noted that the source and drain of the MOSFET are not fixed. For example, the source and the drain of the MOSFET may be changed depending on an applied voltage. In the following description of the embodiment, the source and the drain of the transistor will be referred to as first and second electrodes.

It should be noted that the disclosure is not limited by the source and drain of the transistor in the following description.

The TFTs constituting the gate driver according to an embodiment of the disclosure may be implemented as one or more TFTs among a TFT (oxide TFT) including an oxide semiconductor, a TFT including amorphous silicon (a-Si), and a TFT (LTPS TFT) including low temperature polysilicon (LTPS).

Figure 4:
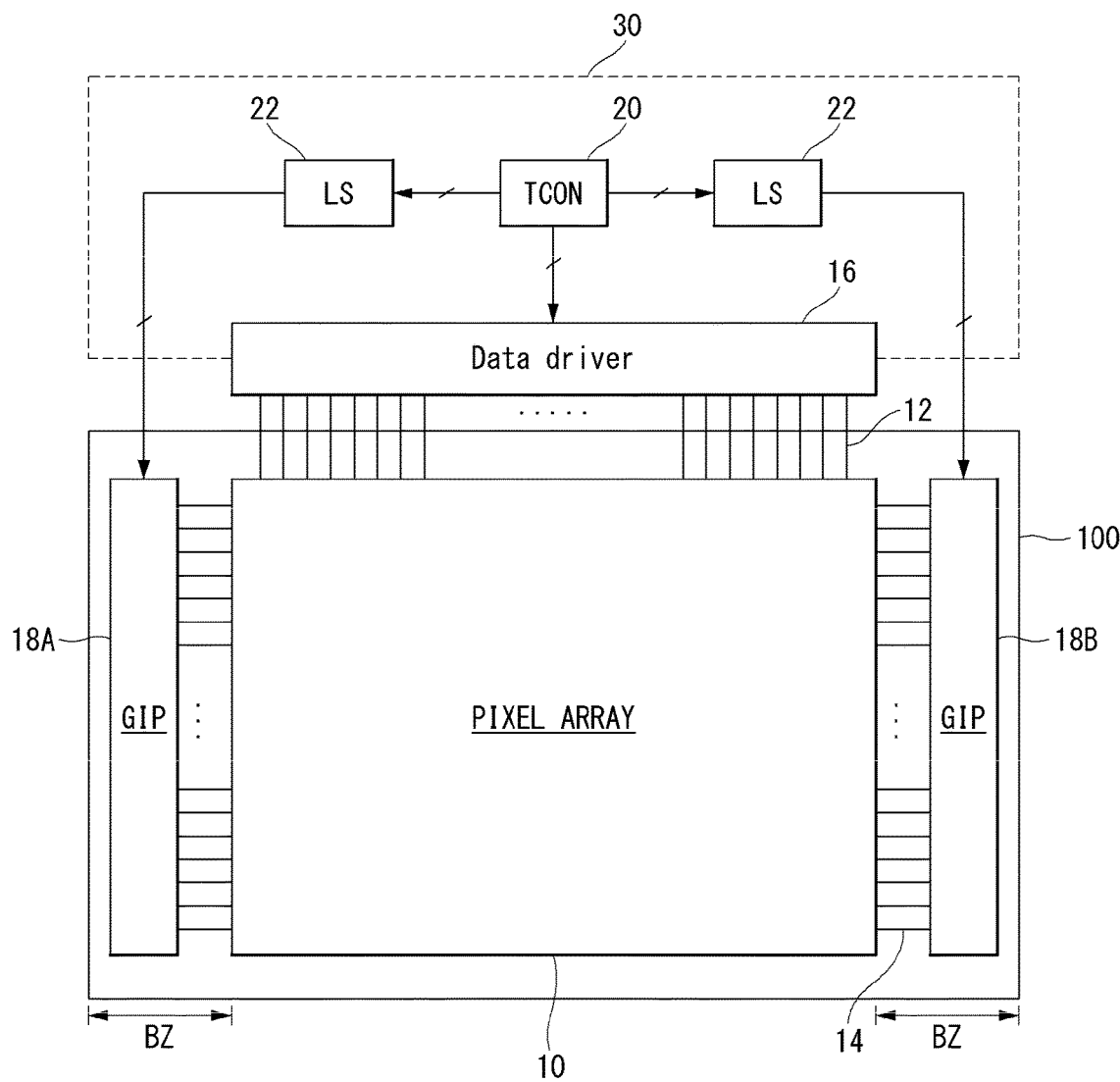
FIG. 4 is a block diagram schematically illustrating a display device according to an embodiment of the disclosure.
Figure 5:
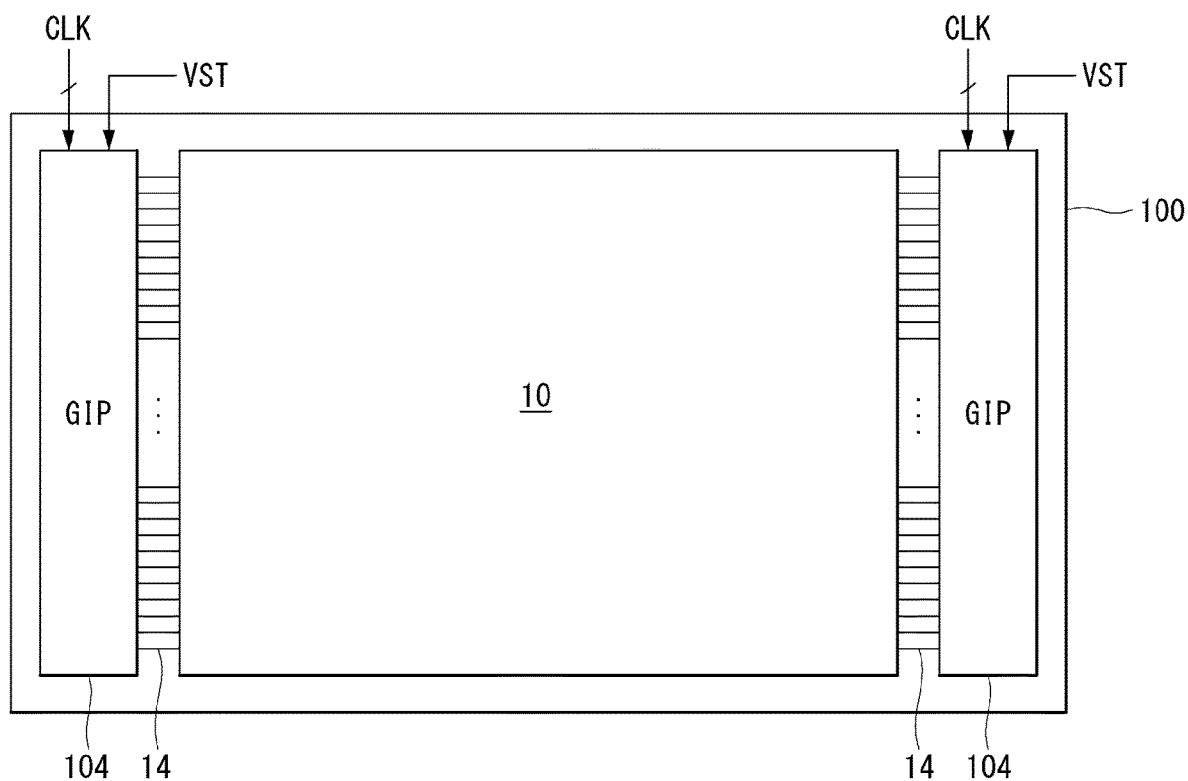
FIG. 5 is a diagram illustrating shift clocks and start pulses supplied to GIP circuits arranged on both sides of a screen.

Referring to FIGS. 4 and 5, a display device according to an embodiment of the disclosure includes a display panel 100, a display driver for writing data of an input image into pixels of a pixel array 10 of the display panel 100.

The display panel 100 includes data lines 12, gate lines 14 arranged transverse to the data lines 12, and a pixel array 10 in which pixels are arranged in a matrix form defined by the data lines 12 and the gate lines 14. The pixel array 10 implements a screen on which the input image is displayed.

The pixels of the pixel array 10 may include red (R), green (G), and blue (B) sub-pixels for color implementation. Each of the pixels may further include a white (W) sub-pixel in addition to the RGB sub-pixels.

The pixel array 10 of the display panel 100 may be divided into a TFT array and a color filter array. The TFT array may be formed on a lower substrate of the display panel 100. The TFT array includes thin film transistors (TFTs) formed at intersections of the data lines 12 and the gate lines 14, a pixel electrode for charging a data voltage, a storage capacitor Cst connected to the pixel electrode to maintain the data voltage, and the like, and displays the input image. An in-cell touch sensor may be disposed on the TFT array. In this instance, the display device further includes a sensor driving unit for driving the in-cell touch sensor.

The color filter array may be formed on an upper substrate or the lower substrate of the display panel 100. The color filter array includes a black matrix, a color filter, and the like. In an instance of a color filter on TFT (COT) or a TFT on color filter (TOC) model, the color filter and the black matrix may be arranged on one substrate together with the TFT array.

The display driver includes a data driver 16 and gate drivers 18A, 18B, and 22 to write the data of the input image to the pixels of the display panel 100.

The data driver 16 includes one or more source driver ICs. The source driver IC may be mounted on a chip on film (COF) and connected between the display panel 100 and a printed circuit board (PCB). The source driver IC may be directly bonded on a substrate of the display panel 100 by a chip on glass (COG) process.

The data driver 16 converts digital video data of the input image received from a timing controller (TCON) 20 into a gamma compensation voltage to output a data voltage. The data voltage output from the data driver 16 is supplied to the data lines 12. A multiplexer (not shown) may be disposed between the data driver 16 and the data lines 12. The multiplexer distributes the data voltage received from the data driver 16 to the data lines 12 under a control of the timing controller 20. In an instance of a 1:3 multiplexer, the multiplexer time-divides the data voltage input through one output channel of the data driver 16 and supplies the data voltage to three data lines in a time division manner. By using the 1:3 multiplexer, the number of channels of the data driver 16 can be reduced to ⅓. Other multiplexers may be utilized in various embodiments provided herein, e.g., 1-to-2 multiplexers, 1-to-4 multiplexers, and so on.

The gate drivers 18A, 18B and 22 include a level shifter (LS) 22 and a GIP circuit 18A and 18B. The level shifter 22 is disposed between the timing controller 20 and the GIP circuit 18A and 18B. The GIP circuit 18A and 18B may be formed directly on the lower substrate of the display panel 100 together with the TFT array.

The GIP circuit 18A and 18B includes a shift register. The GIP circuit 18A and 18B may be formed in a bezel BZ at one side edge of the display panel 100 outside the pixel array 10, or may be formed in a bezel BZ at both side edges. The level shifter 22 shifts a swing width of a gate timing control signal received from the timing controller 20 to a gate-on voltage and a gate-off voltage and outputs the swing width to the GIP circuit 18A and 18B. In the NMOS, the gate-on voltage is a gate-on voltage (VGH) that is higher than a threshold voltage of the NMOS and the gate-off voltage is a gate-off voltage (VGL) that is lower than the threshold voltage of the NMOS. In the PMOS, the gate-on voltage is the gate-off voltage (VGL) and the gate-off voltage is the gate-on voltage (VGH). Hereinafter, transistors of the GIP circuit 18A and 18B will be described with reference to the NMOS, but the disclosure is not limited thereto.

Each of the GIP circuit 18A and 18B, as shown in FIG. 4, shifts a gate pulse in accordance with a shift clock CLK to sequentially supply the gate pulse to the gate lines 14. The shift clock CLK may be a 2-phase clock to an 8-phase clock, but the shift clock CLK is not limited thereto.

The gate pulse output from the GIP circuit 18A and 18B swings between VGH and VGL. VGH is the gate-on voltage higher than the TFT threshold voltage of the pixel. VGL is lower than VGH and is the gate-off voltage lower than the TFT threshold voltage of the pixel. The TFTs of the pixels are turned on in response to VGH of the gate pulse to supply the data voltage from the data lines 12 to the pixel electrode.

FIG. 4 illustrates an example in which the GIP circuit 18A and 18B are arranged to the left and right of the pixel array 10 and is arranged on the left and right sides of the display panel 100. Left and right GIP circuits 18A and 18B are synchronized by the timing controller 20. The left GIP circuit 18A may be connected to odd-numbered gate lines 14 of the pixel array 10 to sequentially supply the gate pulse to the odd-numbered gate lines 14. The right GIP circuit 18B may be connected to even-numbered gate lines 14 of the pixel array 10 to sequentially supply the gate pulse to the even-numbered gate lines 14. The left GIP circuit 18A and the right GIP circuit 18B may be connected to all the gate lines to simultaneously supply the gate pulse to the same gate line.

Figure 6:
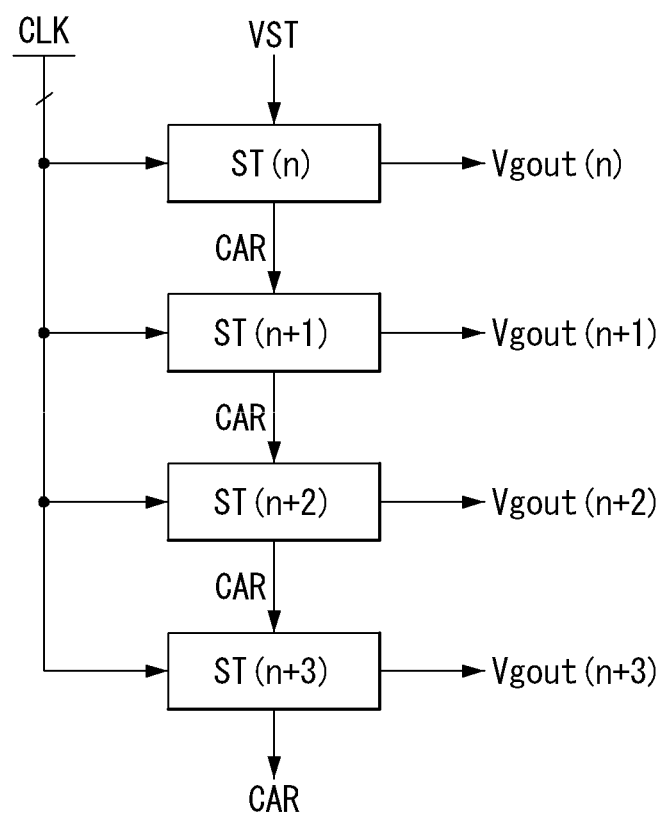
FIG. 6 is a diagram illustrating stages that are connected in a cascade connection manner in a GIP circuit.
Figure 7:
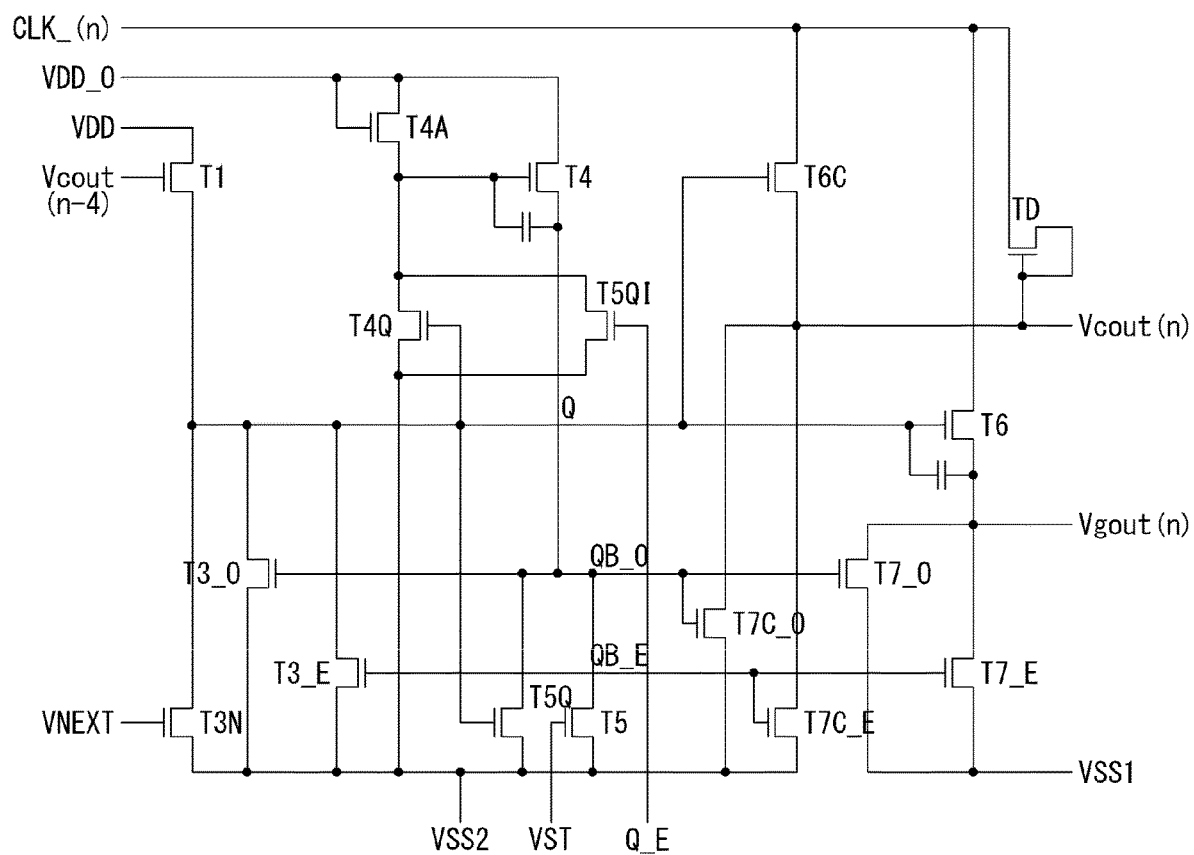
FIG. 7 is a circuit diagram illustrating a GIP circuit according to a first embodiment of the disclosure.

The shift register of the GIP circuit 18A and 18B is connected through a carry signal line through which a carry signal CAR is transmitted in a cascade connection manner as shown in FIG. 6, and includes stages ST(n) to ST(n+3) for shifting the gate pulse in synchronization with the shift clock CLK timing. Each of the stages ST(n) to ST(n+3) sequentially supplies the gate pulse to the gate lines 14 and transmits the carry signal CAR to another stage. The gate pulse and the carry signal may be the same signal output through one output terminal in each stage or may be separate signals that are provided through two separate output terminals in each stage. The stage to which the carry signal CAR is transmitted is not limited to a specific stage. For example, as shown in FIG. 7, an nth (n is a positive integer) stage may receive a carry signal output from an (n−4)th stage, but it is not limited thereto.

The timing controller 20 transmits the digital video data of the input image received from a host system (not shown) to the data driver 16. The timing controller 20 receives timing signals such as a vertical synchronization signal Vsync, a horizontal synchronization signal Hsync, a data enable signal DE, and a main clock MCLK, which are received in synchronization with the data of the input image, and outputs a data timing control signal for controlling operation timing of the data driver 16, and a gate timing control signal for controlling operation timing of the level shifter 22 and the GIP circuit 18A and 18B. The timing controller 20 and the level shifter 22 may be mounted on the PCB 30.

The gate timing control signal includes a start pulse VST, a gate shift clock (GCLK), a gate output enable signal (GOE), and the like. The gate output enable signal (GOE) may be omitted. The start pulse VST is input to a VST terminal in a first stage of the GIP circuit 18A and 18B to control output timing of a first gate pulse that occurs first in one frame period. The gate shift clock (GCLK) controls output timing of the gate pulse in each of the stages of the GIP circuit 18A and 18B to control shift timing of the gate pulse.

The host system may be implemented as any one of a television system, a set-top box, a navigation system, a DVD player, a Blu-ray player, a personal computer (PC), a home theater system, and a phone system. The host system converts the digital video data of the input image into a format suitable for display on the display panel 100. The host system transmits the timing signals (Vsync, Hsync, DE, MCLK) to the timing controller 20 together with the digital video data of the input image. The host system executes an application program associated with coordinate information of a touch input received from a touch sensing unit.

The GIP circuit 18A and 18B of various embodiments of the disclosure includes a diode between at least one of the output terminals and a clock input, and discharges a ripple from an output voltage through the diode to prevent a multi-output phenomenon. The disclosure is applicable to any GIP circuit. FIGS. 7 to 11 illustrate various GIP circuits to which the disclosure is applicable, but the disclosure is not limited thereto.

FIG. 7 is a circuit diagram illustrating an nth stage for outputting nth output voltages Vcout (n) and Vgout (n) in GIP circuits 18A and 18B.

Referring to FIG. 7, an nth stage ST (n) outputs a first output voltage Vcout (n) through a first output terminal and a second output voltage Vgout (n) through a second output terminal. The first output terminal is connected to a VST terminal of another stage ST (n+4) to supply the first output voltage Vcout (n) as a carry signal to the VST terminal of the other stage ST (n+4). The second output terminal is connected to a gate line 14 of a pixel array to supply a gate pulse to the gate line 14.

A QB node is divided into QB_O and QB_E and the QB nodes (QB_O, QB_E) are charged and discharged alternately for a predetermined time so that DC gate bias stress of pull-down transistors T7C_O, T7C_E, T7_O and T7_E is reduced.

Each of the stages of the GIP circuit includes a first pull-up transistor T6C for raising a voltage of the first output terminal depending on a voltage of a Q node, a second pull-up transistor T6 for raising a voltage of the second output terminal depending on the voltage of the Q node, a first pull-down transistor T7C_O for lowering the voltage of the first output terminal depending on a voltage of a first QB node QB_O, a second pull-down transistor T7_O for lowering the voltage of the second output terminal depending on voltage of the first QB node QB_O, a third pull-down transistor T7C_E for lowering the voltage of the first output terminal depending on a voltage of a second QB node QB_E, and a fourth pull-down transistor T7_E for lowering the voltage of the second output terminal depending on the voltage of the second QB node QB_E.

The pull-down transistors T7C_O and T7C_E alternately turn on in response to the voltages of the QB nodes QB_O and QB_E to discharge the voltage of the first output terminal. The pull down transistors T7_O and T7_E alternately turn on in response to the voltage of the QB nodes QB_O and QB_E to discharge the voltage of the second output terminal. A transistor T1 pre-charges the Q node by supplying VDD to the Q node when a carry signal Vout (n–4) from a previous stage is input through a VST terminal. The VDD may be set to a gate-on voltage VGH.

Gates of the pull-up transistors T6C and T6 are connected to the Q node. An nth shift clock CLK_(n) is supplied to a first electrode (drain) of the pull-up transistors T6C and T6 through a clock input. Bootstrapping occurs through a gate-source capacitance of the pull-up transistors T6C and T6 when the gate-on voltage VGH of the shift clock CLK_(n) is input in a state where the pre-charged Q node is floated, so that the voltage of the Q node rises to 2VGH and the pull-up transistors T6C and T6 are turned on. T6C is a pull-up transistor that is turned on depending on the voltage of the Q node to raise the voltage of the first output terminal to output the first output voltage Vcout(n). T6 is a pull-up transistor that is turned on depending on the voltage of the Q node to raise the voltage of the second output terminal to output the second output voltage Vgout(n). A transistor T3N discharges the Q node in response to a carry signal from a next stage S(n+1). Transistors T4A, T4, T4Q, and T5QI supply VDD_O to the QB_O node to charge the QB_O node when the Q node is discharged. A transistor T5Q discharges the QB_O node when the Q node is charged and a transistor T5 discharges and resets the QB_O node in response to a start pulse VST received through a reset terminal RST. QB nodes of all the stages are simultaneously reset when the start pulse VST is generated and transmitted to the transistor T5. Q_E is a Q node of a next stage ST (n+1). Transistors T3_O, T3N, T3_E, T5Q, T5, T7C_O and T7C_E for switching a discharge path of the Q node, the QB nodes and the first output terminal are connected to a second gate-off voltage terminal (VSS2). Transistors T7_O and T7_E for switching a discharge path of the second output terminal are connected to a first gate-off voltage terminal (VSS1). A second gate-off voltage VGL2 (e.g., –10V) supplied to the VSS2 terminal is set to a voltage lower than a first gate-off voltage VGL1 (e.g., –5V) supplied to the VSS1 terminal, so that degradation of the pull-up transistor and a difference in voltage (ΔVp) of pixels can be reduced, and a rising edge time and a falling edge time of the gate pulse can be reduced.

When the pull-down transistors whose gates are connected to the QB nodes QB_O and QB_E are degraded, the voltage of the first and second output terminals are not properly discharged, and a ripple voltage is generated in the output voltages Vcout (n) and Vgout (n). When a ripple is generated in the first output voltage Vcout (n), which is transmitted as a carry signal of the other stage ST (n+4), a ripple voltage is generated in a Q node voltage output through a transistor T1 of the other stage ST (n+4), so that a ripple is generated in an output voltage Vgout (n+4) of the stage ST (n+4) through pull-up transistors T6C and T6 or a capacitance between the Q node and an output terminal. Thus, a ripple generated in the first output voltage Vcout(n) has the effect of causing corresponding ripple voltages in the output voltages of subsequent stages that are connected to the output voltage Vcout(n).

In order to prevent the ripple, the GIP circuits 18A and 18B of embodiments of the disclosure further include a transistor TD connected between the first output terminal and the clock input. The transistor TD is a diode-connected transistor, and thus operates as a diode. The transistor TD includes a first electrode connected to the clock input, and a gate and a second electrode connected to the first output terminal. Hereinafter, the transistor TD will be referred to as a diode. Although the embodiments are shown and described herein as including a diode-connected transistor, the present disclosure is not limited thereto. For example, in one or more embodiments, the diode may be a two-terminal semiconductor diode.

Figure 8:
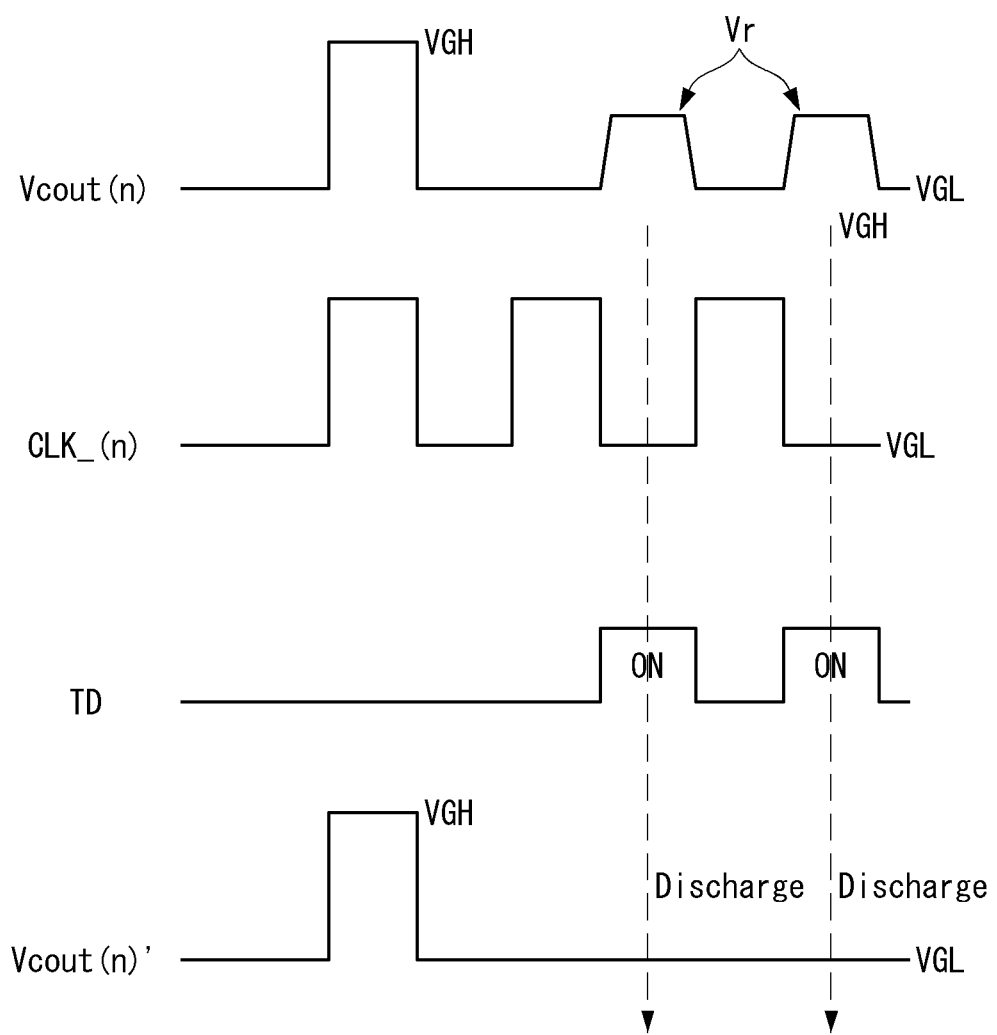
FIG. 8 is a timing diagram illustrating diode operation of a diode shown in FIG. 7.

The shift clock CLK_(n) swings between the gate-on voltage VGH and the gate-off voltage VGL. When the gate on voltage VGH of the shift clock CLK_(n) is supplied to the first electrode of the pull-up transistor T6C in the state where the Q node is pre-charged, as shown in FIG. 8, the voltage of the first output terminal is raised and the first output voltage Vcout (n) rises by VGH. At this time, since the voltages of the shift clock CLK_(n) and the first output voltage Vcout (n) are both equal to VGH, Vds of the diode TD becomes 0 and the diode TD maintains an off state. Therefore, the first output voltage Vcout (n) is not discharged through the diode TD and is supplied to the transistor T1 of the other stage ST (n+4).

As shown in FIG. 8, in an instance of an unwanted ripple voltage other than the first output voltage Vcout (n), when a voltage of the clock input is VGL, since the ripple voltage Vr is higher than the voltage of the clock input by at least a threshold voltage of the diode TD, Vds>Vth of the diode TD, and the diode TD is turned on. As a result, the ripple voltage Vr is discharged through the clock input. The first output voltage Vcout (n)' is supplied to a gate of the transistor T1 formed in the other stage ST (n+4) and pre-charges the Q node voltage of the stage ST (n+4) to the voltage VGH. The ripple of the Q node voltage of the stage ST (n+4) to which the first output voltage Vcout (n) is supplied as the carry signal can be prevented if the ripple voltage does not exist in the first output voltage Vcout (n)', so that a ripple of the output voltages (Vcout (n+4), Vgout (n+4)) of the next stage ST (n+4) can be prevented.

Figure 9:
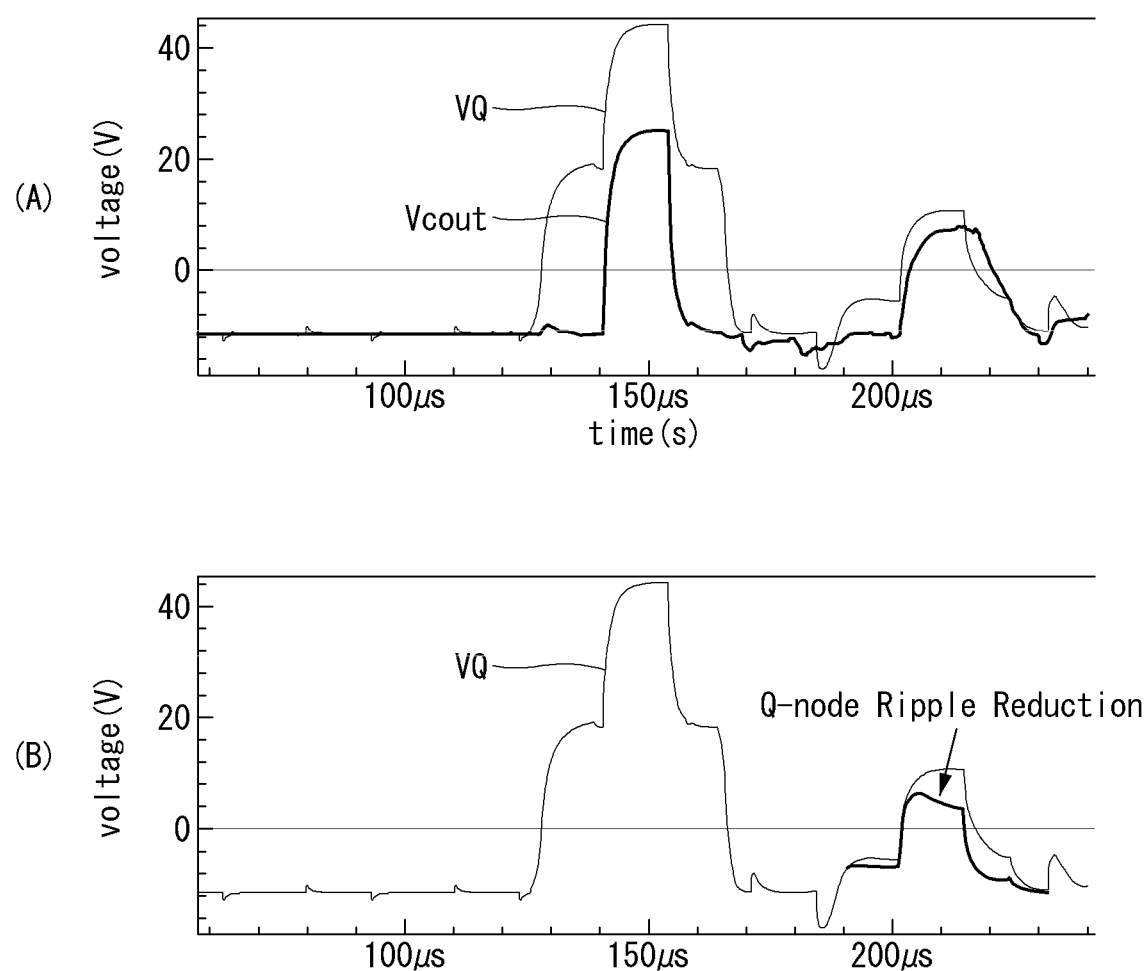
FIGS. 9(A) and 9(B) are simulation results illustrating a ripple voltage depending on presence or absence of a diode shown in FIG. 7.

FIG. 9 is a simulation result illustrating a ripple voltage depending on presence or absence of a diode TD shown in FIG. 7. In FIG. 9, x-axis is time and y-axis is voltage. VQ is the voltage of the Q node, and Vcout is the first output voltage. Without the diode TD, there is a multi-output phenomenon including the ripple at the voltage VQ of the Q node and the first output voltage Vcout, as shown in FIG. 9(A). As a result of connecting the diode TD between the clock input and the first output terminal, it is confirmed that the ripple voltage is reduced or removed from the first output voltage Vcout (n), as shown in FIG. 9(B) and the ripple voltage is also removed from the voltage VQ of the Q node.

Figure 10:
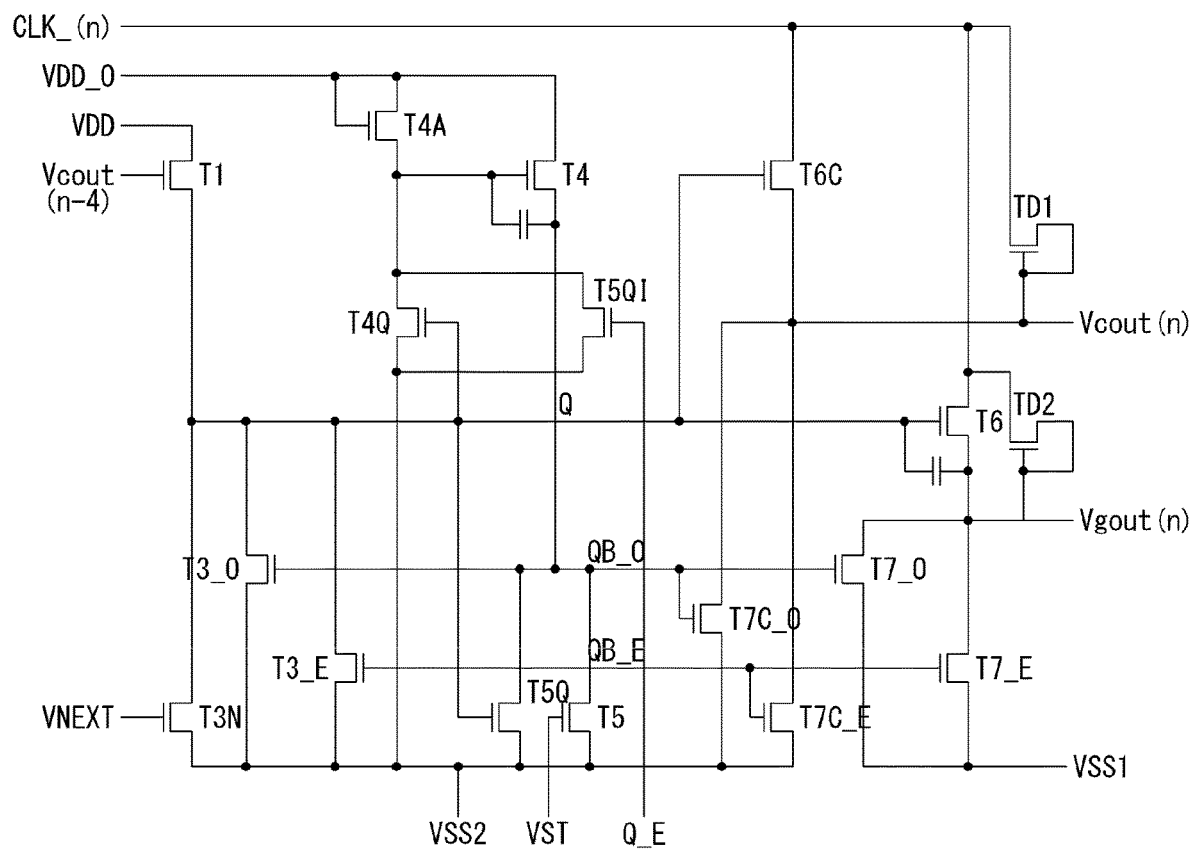
FIG. 10 is a circuit diagram illustrating a GIP circuit according to a second embodiment of the disclosure.

FIG. 10 is a circuit diagram illustrating a GIP circuit according to a second embodiment of the disclosure.

Referring to FIG. 10, an nth stage ST (n) outputs a carry signal Vcout (n) through a first output terminal and a gate pulse Vgout (n) through a second output terminal. The first output terminal is connected to another stage. The second output terminal is connected to a gate line 14 of a pixel array. The carry signal Vcout (n) is transmitted to an (n+4)th stage and the gate pulse is supplied to the gate line 14.

This GIP circuit is the same as the embodiment of FIG. 7 described above except that diodes TD 1 and TD 2 are connected to the first and second output terminals, respectively. Therefore, detailed description of other transistors except for the diodes TD 1 and TD 2 will be omitted.

A first diode TD1 is connected between a clock input and the first output terminal and is turned on when an unwanted ripple voltage is generated at a first output voltage Vcout (n) to discharge the ripple voltage through the clock input. The first diode TD1 includes a first electrode connected to the clock input and a gate and a second electrode connected to the first output terminal.

A second diode TD2 is connected between the clock input and the second output terminal and is turned on when an unwanted ripple voltage is generated at a second output voltage Vgout (n) to discharge the ripple voltage through the clock input. The second diode TD2 includes a first electrode connected to the clock input, and a gate and a second electrode connected to the second output terminal.

Figure 11:
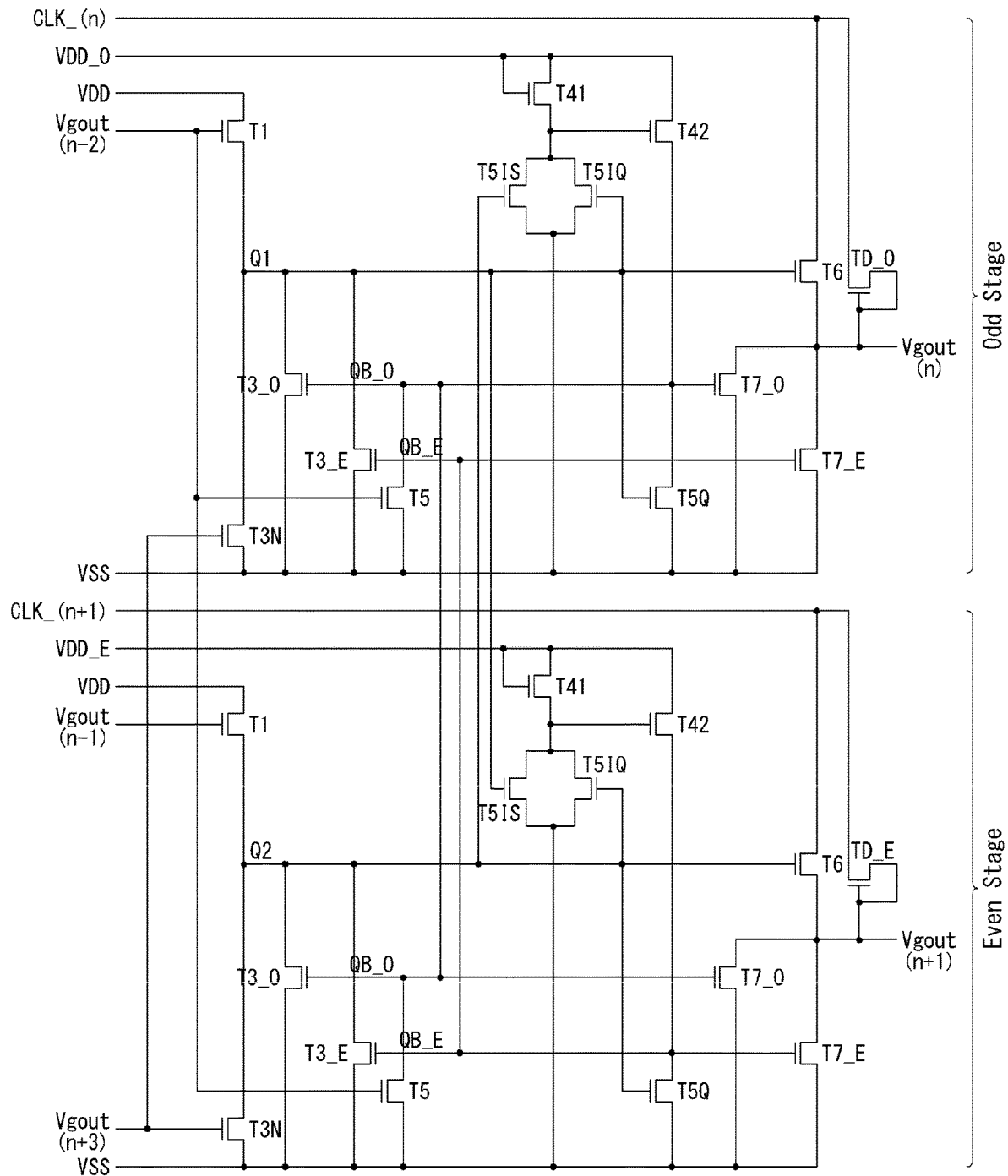
FIG. 11 is a circuit diagram illustrating a GIP circuit according to a third embodiment of the disclosure.

FIG. 11 is a circuit diagram illustrating a GIP circuit according to a third embodiment of the disclosure. FIG. 11 illustrates two neighboring stages in the GIP circuits 18A and 18B.

Referring to FIG. 11, in the GIP circuits 18A and 18B, a QB node is divided into QB_O and QB_E, and the QB nodes (QB_O, QB_E) are charged and discharged alternately for a predetermined time, so that DC gate bias stress of pull-down transistors T7_O and T7_E can be reduced. Each of the stages of the GIP circuits 18A and 18B raises output voltages Vgout (n) and Vgout (n+1) through a respective pull-up transistor T6 and lowers the output voltages Vgout (n) and Vgout (n+1) through respective pull-down transistors T7_O and T7_E. An nth output voltage Vgout (n) output from an nth stage is supplied to an nth gate line 14 as a gate pulse and to a VST terminal of an (n+2)th stage as a carry signal. An (n+1)th output voltage Vgout (n+1) output from an (n+1)th stage is supplied to an (n+1)th gate line 14 as a gate pulse and to a VST terminal of an (n+3)th stage and a VNEXT terminal of an (n−1)th stage as a carry signal.

In order to reduce an area of the GIP circuit in a high-resolution display device, the GIP circuits 18A and 18B are configured such that the QB nodes (QB_O, QB_E) and a VNEXT terminal are shared in the neighboring nth and (n+1)th stages. The QB_O nodes of the nth and (n+1)th stages are connected to each other, and the QB_E nodes of the nth and (n+1)th stages are connected to each other. The VNEXT terminal to which a carry signal Vgout (n+3) from a next stage is applied is commonly connected to the nth and (n+1)th stages.

Each of the stages of the GIP circuits 18A and 18B includes a pull-up transistor T6 connected to Q nodes (Q1, Q2), pull-down transistors T7_O and T7_E connected to the QB nodes (QB_O, QB_E), and switch circuits T1, T3_O, T3_E, T41, T42, T5IS, T5IQ, T5Q and T5 for charging and discharging the Q nodes (Q1, Q2) and the QB nodes (QB_O, QB_E). When carry signals (Vgout (n−2), Vgout (n−1)) from previous stages are input to VST terminals, transistors T1 are turned on and gate-on voltages VGH from VDD terminals are supplied to the Q nodes (Q1, Q2). Therefore, the Q nodes (Q1, Q2) are pre-charged. Transistors T3N discharge the Q nodes (Q1, Q2) in response to the carry signal Vgout (n+3) of the next stage received through the VNEXT terminal. The transistors (T41, T42, T5IS, T5IQ, and T5Q) constitute an inverter for charging the QB nodes (QB_O, QB_E) with an AC voltage (VDD_O, VDD_E) depending on a Q node voltage and for discharging the QB nodes (QB_O, QB_E) by connecting the QB nodes (QB_O, QB_E) to a VSS terminal. The transistors (T41, T42, T5IS, T5IQ, and T5Q) disposed in the nth stage supply the VDD_O to the QB_O node and charge the QB_O node of the nth and (n+1)th stages when the Q node (Q1, Q2) are discharged. The transistors (T41, T42, T5IS, T5IQ, and T5Q) disposed in the (n+1)th stage supply the VDD_E to the QB_E node and charge the QB_E node of the nth and (n+1)th stages when the Q nodes (Q1, Q2) are discharged.

Each of the nth and (n+1) stages further includes a diode (TD_O, TD_E) connected between a clock input and an output terminal. Each of the diodes (TD_O, TD_E) discharges a ripple voltage of the output terminal through the clock input to prevent or reduce the ripple voltage of the output voltages (Vgout (n), Vgout (n+1)) and a ripple of the Q node voltage of the next stage.

The GIP circuit shown in FIG. 11 does not separately output the carry signals, but embodiments provided herein are not limited thereto. For example, a circuit in which the carry signal Vcout is separately output from the GIP circuit applied in FIG. 7 and FIG. 10 may be added to the GIP circuit shown in FIG. 11. For example, in FIG. 11, a pull-up transistor for raising a voltage of the carry signal (Vcout) may be added to the Q node, and a pull-down transistor for lowering a voltage of the carry signal (Vcout) may be further added to the QB node. In the GIP circuit shown in FIG. 11, the VSS terminal may be separated by the method shown in FIG. 7 to set a voltage of the VSS terminal to two voltages.

Figure 12:
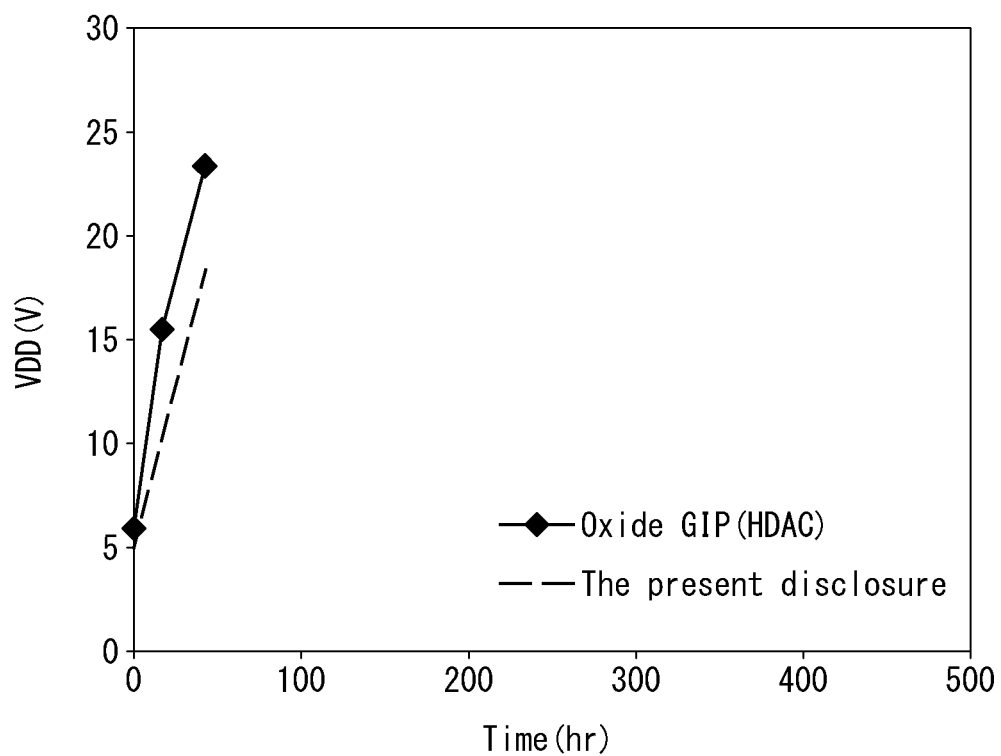
FIG. 12 is a graph illustrating a reliability evaluation result depending on whether or not diodes are applied in a GIP circuit shown in FIG. 11.

FIG. 12 illustrates a reliability evaluation result depending on whether or not diodes (TD_O, TD_E) are applied. A reliability evaluation was performed on a circuit in which the transistors of the GIP circuit shown in FIG. 11 are implemented by an oxide TFT. In an instance of applying the diode (TD_O, TD_E), stable output characteristics can be obtained even though the VDD voltage is further lowered when an aging time is the same as in an instance of not applying the diode (TD_O, TD_E).

As described above, embodiments of the disclosure can prevent or reduce the ripple voltage of the carry signal and the ripple of the Q node voltage by connecting a diode to at least one of the output terminals of the GIP circuit, from which a carry signal is output.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A gate driver, comprising:
 a plurality of stages connected in a cascade connection manner, each of the stages including:
  a clock input configured to receive a shift clock signal,
  a first output terminal connected to an input of another stage of the plurality of stages,
  a second output terminal connected to a gate line of a display panel, and a first diode having a first terminal directly connected to the clock input and a second terminal directly connected to the first output terminal, wherein each of the stages generates a first output voltage that is transmitted to the another stage through the first output terminal and a second output voltage that is supplied to the gate line of the display panel through the second output terminal, and wherein when a voltage of the first output terminal is higher than a voltage of the clock input by at least a threshold voltage of the first diode, the first diode is turned on and the voltage of the first output terminal is discharged through the clock input.

2. The gate driver of claim 1, wherein the first diode comprises a diode-connected transistor.

3. The gate driver of claim 1, wherein each of the stages includes a second diode connected between the clock input and the second output terminal, and when a voltage of the second output terminal is higher than a voltage of the clock input by at least a threshold voltage of the second diode, the second diode is turned on and the voltage of the second output terminal is discharged through the clock input.

4. The gate driver of claim 3, wherein the first and second diodes comprise diode-connected transistors.

5. The gate driver of claim 1, wherein each of the stages includes a plurality of transistors, and each of the transistors includes an oxide semiconductor.

6. The gate driver of claim 1, wherein each of the stages includes:

a first pull-up transistor configured to raise the voltage of the first output terminal depending on a voltage of a Q node, the Q node being a first internal node of the stages;

a second pull-up transistor configured to raise a voltage of the second output terminal depending on the voltage of the Q node;

a first pull-down transistor configured to lower the voltage of the first output terminal depending on a voltage of a first QB node, the first QB node being a second internal node of the stages;

a second pull-down transistor configured to lower the voltage of the second output terminal depending on the voltage of the first QB node;

a third pull-down transistor configured to lower the voltage of the first output terminal depending on a voltage of a second QB node that is charged alternately with the first QB node, the second QB node being a third internal node of the stages; and a fourth pull-down transistor configured to lower the voltage of the second output terminal depending on the voltage of the second QB node.

7. The gate driver of claim 6, wherein a first plurality of transistors configured to switch a discharge path of the second output terminal are connected to a first gate-off voltage terminal (VSS1), a second plurality of transistors configured to switch a discharge path of the Q node, the QB nodes and the first output terminal are connected to a second gate-off voltage terminal (VSS2), and a second gate-off voltage supplied to the VSS2 terminal is lower than a first gate-off voltage supplied to the VSS1 terminal.

8. The gate driver of claim 6, wherein the first QB nodes of neighboring stages are connected to each other, and the second QB nodes of neighboring stages are connected to each other.

9. A display device comprising:

a display panel in which data lines and gate lines are arranged in intersecting directions, and pixels are arranged in a matrix form; and a display driver configured to write data of an input image to the pixels, the display driver including a shift register having a plurality of stages connected in a cascade connection manner and configured to sequentially supply gate pulses to the gate lines, each of the stages including:

a clock input configured to receive a shift clock signal;

a first output terminal connected to an input of another stage of the plurality of stages, the first output terminal configured to supply a first output voltage to the another stage;

a second output terminal connected to a gate line of the display panel, the second output terminal configured to supply a second output voltage to the gate line of the display panel; and a first diode having a first terminal directly connected to the clock input and a second terminal directly connected to the first output terminal, wherein when a voltage of the first output terminal is higher than a voltage of the clock input by at least a threshold voltage of the first diode, the first diode is turned on and the voltage of the first output terminal is discharged through the clock input.

10. The display device of claim 9, wherein the first diode comprises a diode-connected transistor.

11. The display device of claim 9, wherein each of the stages includes a second diode connected between the clock input and the second output terminal, and when a voltage of the second output terminal is higher than a voltage of the clock input by at least a threshold voltage of the second diode, the second diode is turned on and the voltage of the second output terminal is discharged through the clock input.

12. The display device of claim 11, wherein the first and second diodes comprise diode-connected transistors.

13. The display device of claim 9, wherein each of the stages includes a plurality of transistors, and each of the transistors includes an oxide semiconductor.

14. The display device of claim 9, wherein each of the stages includes:

a first pull-up transistor configured to raise the voltage of the first output terminal depending on a voltage of a Q node, the Q node being a first internal node of the stages;

a second pull-up transistor configured to raise a voltage of the second output terminal depending on the voltage of the Q node;

a first pull-down transistor configured to lower the voltage of the first output terminal depending on a voltage of a first QB node, the first QB node being a second internal node of the stages;

a second pull-down transistor configured to lower the voltage of the second output terminal depending on the voltage of the first QB node;

a third pull-down transistor configured to lower the voltage of the first output terminal depending on a voltage of a second QB node that is charged alternately with the first QB node, the second QB node being a third internal node of the stages; and a fourth pull-down transistor configured to lower the voltage of the second output terminal depending on the voltage of the second QB node.

15. The display device of claim 14, wherein a first plurality of transistors configured to switch a discharge path of the second output terminal are connected to a first gate-off voltage terminal (VSS1),
- a second plurality of transistors configured to switch a discharge path of the Q node, the QB nodes and the first output terminal are connected to a second gate-off voltage terminal (VSS2) terminal, and
- a second gate-off voltage supplied to the VSS2 terminal is a voltage lower than a first gate-off voltage supplied to the VSS1 terminal.

16. The display device of claim 14, wherein the first QB nodes of neighboring stages are connected to each other, and the second QB nodes of neighboring stages are connected to each other.

17. A gate driver, comprising:
- a plurality of stages, each of the stages including:
  - a clock input configured to receive a shift clock signal;
  - an output terminal configured to supply an output voltage to another stage of the gate driver;
  - a pull-up transistor, a first electrode of the pull-up transistor coupled to the clock input, a second electrode of the pull-up transistor coupled to the output terminal, and a gate terminal of the pull-up transistor coupled to a Q node, the Q node being a first internal node of the stages;
  - a first pull-down transistor, a first electrode of the first pull-down transistor coupled to a low supply voltage, a second electrode of the first pull-down transistor coupled to the output terminal, and a gate electrode of the first pull-down transistor coupled to a first QB node, the first QB node being a second internal node of the stages;
  - a second pull-down transistor, a first electrode of the second pull-down transistor coupled to the low supply voltage, a second electrode of the second pull-down transistor coupled to the output terminal, and a gate electrode of the second pull-down transistor coupled to a second QB node; and
  - a diode having a first terminal directly connected to the clock input and a second terminal directly connected to the output terminal, the first terminal of the diode electrically connected to the first electrode of the pull-up transistor and the second terminal of the diode electrically connected to the second electrode of the pull-up transistor,
  - wherein when a voltage of the output terminal is higher than a voltage of the clock input by at least a threshold voltage of the diode, the diode is turned on and the voltage of the output terminal is discharged through the clock input.

18. The gate driver of claim 17, wherein the plurality of stages includes a first stage and a second stage neighboring the first stage, wherein the Q nodes of the first and second stages are coupled to one another, the first QB nodes of the first and second stages are coupled to one another, and the second QB nodes of the first and second stages are coupled to one another.

* * * * *